United States Patent [19]

Hallford

[11] Patent Number: 4,604,585
[45] Date of Patent: Aug. 5, 1986

[54] MICROWAVE PLUG-IN SIGNAL AMPLIFYING MODULE

[75] Inventor: Ben R. Hallford, Wylie, Tex.

[73] Assignee: Rockwell International Corporation, El Segundo, Calif.

[21] Appl. No.: 784,961

[22] Filed: Oct. 7, 1985

[51] Int. Cl.⁴ ............................ H03F 3/60; H03F 3/14
[52] U.S. Cl. ...................................... 330/286; 330/307
[58] Field of Search ................. 330/171, 277, 286, 53, 330/307; 361/392, 394; 333/35

[56] References Cited

U.S. PATENT DOCUMENTS 4,472,690  9/1984  Hallford ............................. 333/35

Primary Examiner—James B. Mollins
Assistant Examiner—G. Wan
Attorney, Agent, or Firm—Bruce G. Lutz; V. L. Sewell; H. Fredrick Hamann

[57] ABSTRACT

A unitary component operating as a low noise amplifier incorporates several other tuning components in conjunction with an FET. By adjusting the tuning components, the overall amplification and impedance characteristics of the unit can be standardized in spite of typical variations in impedance and amplifying characteristics of the FET by itself. The incorporation of such a drop-in module in a microwave circuit, simplifies testing and repair of the remaining portions of the circuit, since the drop-in modules can easily be tested and adjusted for proper operation in a test jig separate from the actual operating circuit.

4 Claims, 8 Drawing Figures

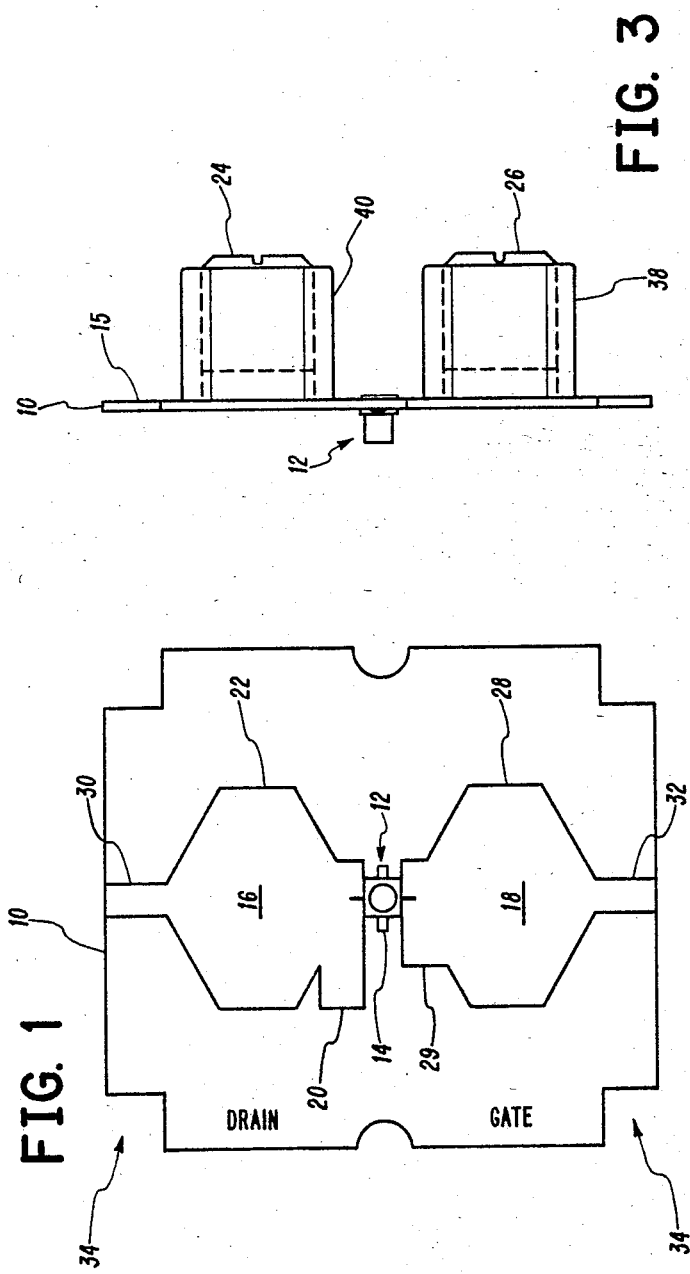

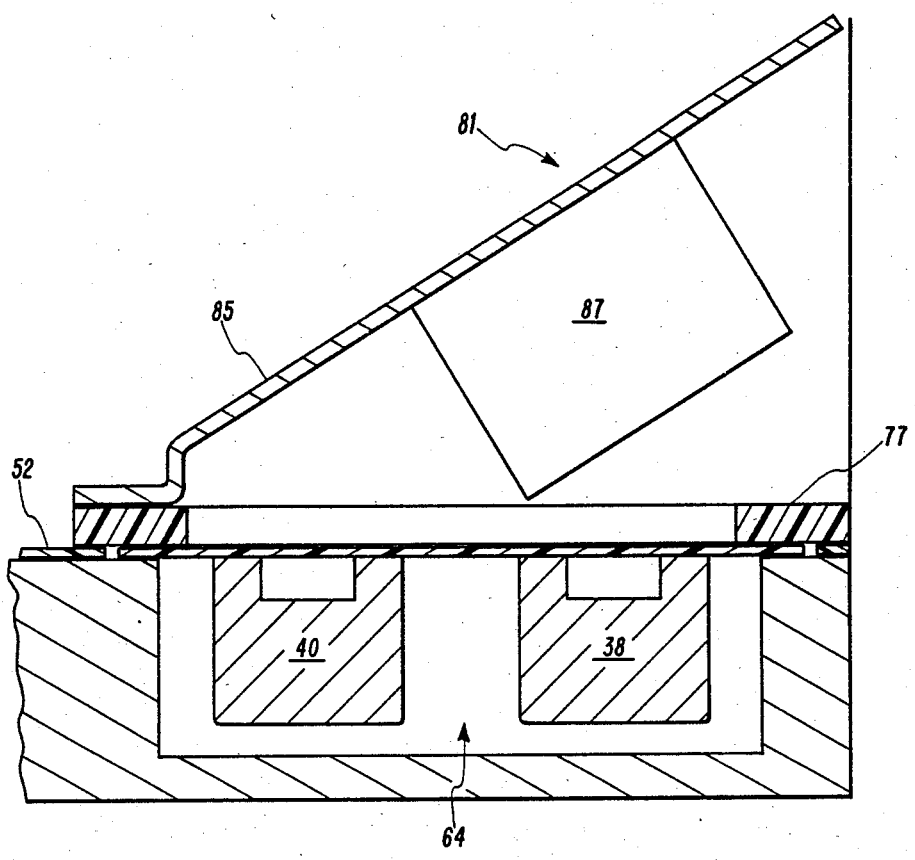
FIG. 6
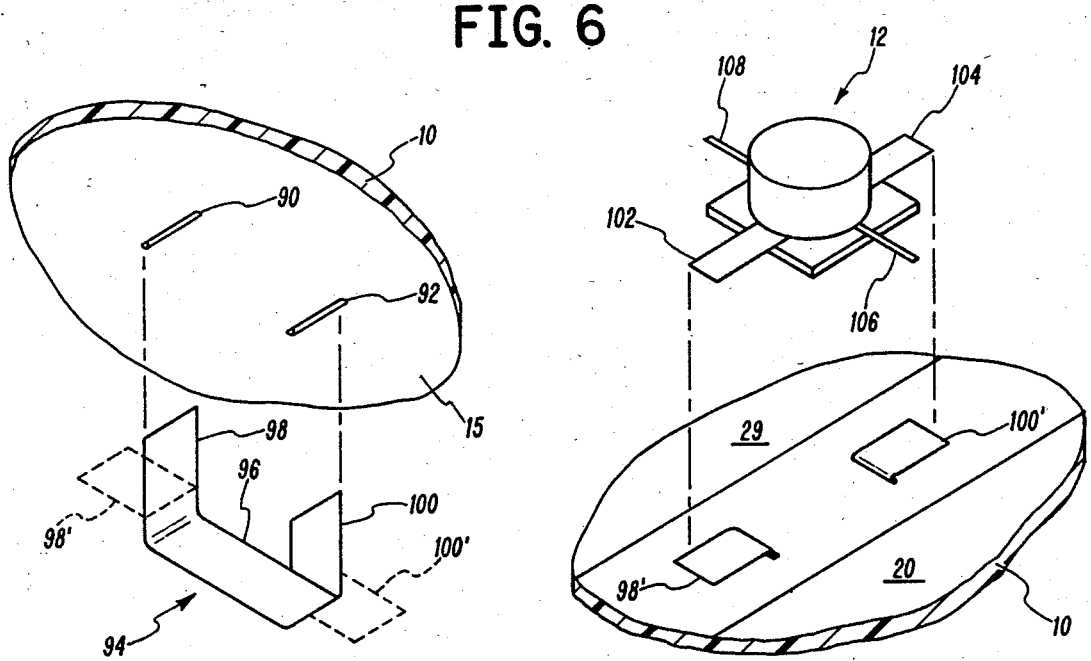
FIG. 7
FIG. 8

MICROWAVE PLUG-IN SIGNAL AMPLIFYING MODULE

THE INVENTION

The present invention is directly related to electronics, and more specifically, related to microwave electronic circuitry. Even more specifically, it is related to problems involved in tuning circuits containing active components, such as field effect transistors (FET's) which vary widely in characteristics from unit to unit.

BACKGROUND

When designing and manufacturing microwave equipment including low noise amplifiers, the active element, such as a field effect (FET) transistor, must be properly connected to a circuit that presents the optimum source and load impedance to its input and output terminals. Some means must be provided to alter these impedances to compensate for variations in the FET's and in specific circuit dimensions. The higher the frequency involved in the microwave circuit, the more critical these variances become. For microwave low noise amplifier (LNA) cirCuils that use GaAs MESFET transistors on microstrip circuits, some means must be provided to trim the matching circuit geometry at the transistor terminals to compensate for changes in the optimum source and load impedances of the transistors from different lots. One method of accomplishing this tuning and transistor characteristic matching may be found in a patent granted to one of the present inventors and assigned to the same assignee as the present invention and given U.S. Pat. No. 4,472,690.

Some microwave circuits using ceramic substrates are designed with the FET devices mounted to the ground plane using flanges that may be bolted to a metal plate. Other FET devices are physically mounted using solder type attaching mechanisms. However, in either case, the ceramic substrate that is connected to the FET must be soldered to a common ground plane to ensure intimate contact of the substrate ground plane with the FET ground flange to the chassis ground plane. The impedance matching stubs for a typical FET are etched or plated on a dielectric substrate causing them to present fixed impedances to the FET. When a FET is replaced by a different FET, the different noise parameters require that the impedance matching stubs be retuned using suitable metal or dielectric chips. The tuning operations can be expensive and require trained personnel to carefully assemble and test the amplifiers.

Although the above approaches have worked at frequencies of up to six gigahertz, the problems associated with the prior art approach are amplified even further as the frequency is extended beyond six gigahertz.

The solution of the present invention is to incorporate the compensation necessary to tune the active components on a unitary structure, which can be easily tested and adjusted to have a standardized set of characteristics in spite of variations in individual active and passive components, producing the assemblage to simplify testing and trouble shooting of the remaining circuitry.

It is thus an object of the present invention to provide a low noise amplifier module.

Other objects and advantages of the present invention may be ascertained from a reading of the specification and appended claims in conjunction with the drawings wherein:

FIG. 1 is a plan view of a module incorporating active and passive components and which is the subject of the invention;

FIG. 2 is a side view of FIG. 1;

FIG. 3 is an end view of FIG. 1;

FIG. 6 is a cross-sectional view through the lines 6-6 of FIG. 4 with the apparatus of FIG. 5 assembled and mounted therein;

FIG. 7 is a isometric view of a clip used in facilitating the connection of an FET on one side of a substrate to the ground plane on the opposite side; and FIG. 8 is a isometric view of the substrate on the side opposite that shown in FIG. 7 showing the clip and the FET to be mounted thereupon.

DETAILED DESCRIPTION

Figure 4:
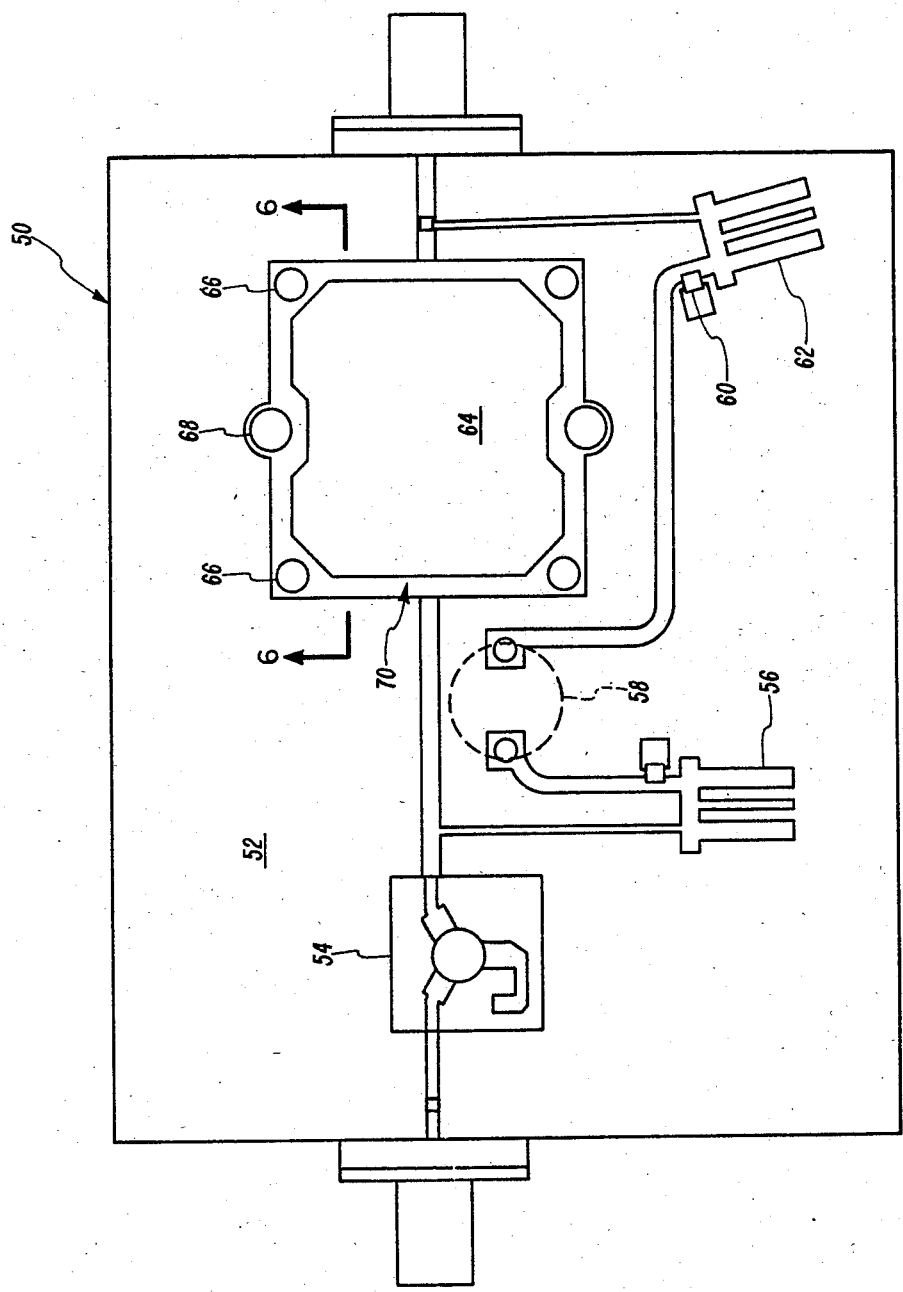
FIG. 4 is a plan view of a microwave circuit having an opening for the insertion of a module of the type shown in FIG. 1.

In FIG. 1, a substrate 10 is shown having mounted thereon an FET 12 having source leads 14 connected through the substrate 10 to a ground plane 15 on the other side, and having its gate and drain leads connected to gate and drain tuning means 18 and 16, respectively. A portion of tuning means 16 closest to FET 12 comprises a fixed open circuited impedance tuning stub 20, while the elongated portion 22 comprises a variable impedance quarter wave transformer portion which acts in conjunction with screw type adjustable slugs, one of which is shown as 24 in FIG. 3. A further adjustable slug 26 is shown in FIG. 3 as coacting with a main portion 28 of tuning means 18. This portion is connected to the gate of FET 12. In addition, there is a fixed open circuited impedance tuning stub 29 which comprises a further portion of tuning means 18. The portion 22 also comprises a part of the transmission path and provides a transition in impedance to a standard width 50 ohm transmission path 30 for connection to transmission paths on a microwave circuit, such as illustrated in FIG. 4. Tuning means 18 includes a transition connected to a typical width 50 ohm circuit path element 32 for connection to another circuit path on a circuit board, such as illustrated in FIG. 4. The corners of the substrate 10 have cut-outs, shown generally as 34, on each of the corners, which allow room for screws or other mounting means to hold the module of FIG. 1 in firm electrical contact with the ground plane of FIG. 4, to be later described.

FIG. 2 shows many of the components of FIG. 1 and the same numbers are used where applicable. In addition, a further tuning screw 36 is shown for providing a tuning adjustment within a tuner housing 38 and acting in conjunction with tuning screw 26 to affect the impedance of tuning means 18.

FIG. 3 uses the same numbers as are used in FIG. 1 and, in addition, shows a second tuner housing means 40, which houses the tuning screw 24 and, an additional tuning screw, not shown. As will be realized, this set of tuning screws operate in conjunction with the tuning means 16 to affect the impedance at the drain terminal of FET 12.

FIG. 4 shows a metal enclosure, generally designated as 50, having a substrate 52, and a plurality of components, such as 54, 56, dash line component 58 mounted on the opposite side of substrate 52, a capacitor 60 and a filter means 62 similar to that of 56. While these components provide no necessary part of the present inventive concept, they are illustrated for the purpose of completing the presentation of an environment in which the inventive concept can be used. Beneath the substrate 52 is a ground plane which contains a cavity, generally designated as 64, and is deep enough to allow for insertion of the housing means, such as 38 and 40, of the device shown in FIGS. 1 through 3. Screw holes, such as 66 at each corner, and 68 at intermediate positions around the opening 64, are used to provide a mechanical mounting of the module of FIG. 1 with the substrate resting on an upper portion of the ground plane and designated as 70.

Figure 5:
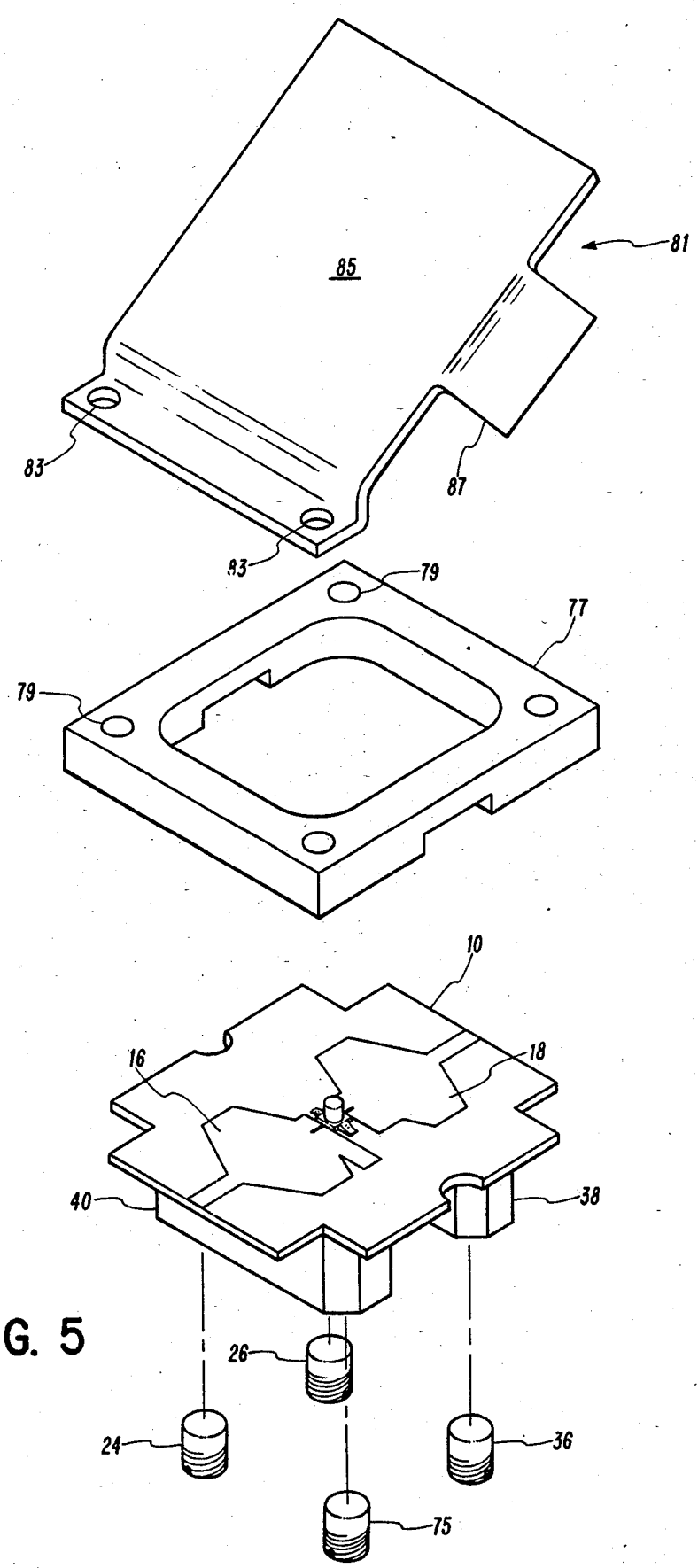
FIG. 5 is an exploded view of the module of FIG. 1 in combination with hold-down and space feedback parts used to properly secure the module of FIG. 1 in FIG. 4, and to enhance the amplifying characteristics of the device.

In FIG. 5, the same numbers are used as used in FIGS. 1 through 3, and shows a final tuning screw 75, in addition to the other three specifically referenced. This exploded view also shows an insulating type holddown device 77, having holes designated as 79. This is used to physically distribute the pressure of the screws over the surface of substrate 10 to provide reasonably uniform contact with the ground plane 70 of FIG. 4. A space feedback shield 81 is shown with holes 83 at one end thereof, a main portion 85 and extended arms or legs 87. The main portion 85 and the arm or leg 87, along with a leg on the other side, not shown, for a U-shaped portion. The part 85 forms an angle with the base containing the holes 83, which in one embodiment of the invention, provided a field perturbing device mounted at an angle of approximately 45° with respect to the surface of the substrate 10 of the module of FIG. 1.

Although, in FIG. 6, screws are not shown for holding the items in place, the module along with the holddown device 77 and the space feedback portion 81 are shown in assembled positions with respect to the substrate 52 and the ground plane 70, including the cavity 64 as illustrated in FIG. 4. As before, the numbers used in previous figures are all used as applicable.

In FIGS. 7 and 8, the same numbers are utilized as is used in previous figures. Thus, a portion of the substrate board 10 is shown with the o backplane 15 and two opening slots 90 and 92. A U-shaped clip generally designated as 94 has a bit or base portion 96 and first and second leg or tab portions 98 and 100. Dash line portions 98' and 100' illustrate the configuration of the U-shaped member 94 after it is inserted through the slots 90 and 92 and bent over to the position shown in FIG. 8.

In FIG. 8, a view from the topside of substrate 10 is shown wherein the legs 98 and 100 are bent over and given the designation 98' and 100'. When the tabs are in this condition, the bit portion 96 can be electrically soldered to the backplane 15 and provide a consistent impedance from the backplane to the source leads of transistor 12. As illustrated, transistor 12 has source leads 102 and 104 with a drain lead 106 and a gate lead 108. When the transistor 12 is mounted on the substrate, a solder connection is made between source lead 102 and tab 98', as well as making an electrical connection between source lead 104 and tab 100'. Additionally, there is an electrical connection made between the drain lead 106 and the electrical stub 20, and a further electrical connection is made between gate lead 108 and the electrical stub 29.

OPERATION

As previously indicated, the ability to tune the low noise amplifier module, comprising the apparatus of FIG. 1, in a controlled test environment separate from the operating circuit, is a definite advantage in testing the operability of a circuit. Since the low noise amplifier is adjusted to a standardized set of values, this eliminates a wide range of parameter variations for the overall circuit, thus the remaining portion of the circuit can more easily be adjusted and checked for component inoperability or components that are out of tolerance. Further, a through transmission line can be placed between the leads leading to the opening, illustrated more clearly in FIG. 4, into which the module is normally inserted and circuit parameters tested without the amplifier. This approach eliminates the requirement to unsolder components and possibly destroy same. The present design approach provides an advantageously short electrical path for grounding the source leads on the FET.

While the ground plane tuners comprising the tuning housings 38 and 40 and their associated screws are identical for the gate and drain side, they could be different if the gate and drain impedance ranges were to be signficantly different. As illustrated, the tuner housings are soldered to the ground plane over the ground plane cutouts beneath the quarter wave transformer conductors 16 and 18. These housings, in combination with the tuning screws, form a sealed compartment on the ground side which eliminates radiation losses and problems that could result from improper ground plane contact between the substrate ground and the mounting plate. The two tuning screws in each tuner are uniformly advanced into the housing 38 or 40, while observing noise figure and gain at the desired RF input frequency. The adjustable gate tuners, using the screws associated with the housing 38 beneath the gate transmission path tuning means 18, are primarily adjusted to reduce the noise figure. The drain tuners comprising housing 40 are adjusted to primarily maximize the gain. In one embodiment of the invention, the screws such as 24, 26, 36 and 75 are friction mounted so that they do not require any further locking devices.

The stubs, 20 and 29, forming a portion respectively of the transmission line paths 16 and 18 form open circuited low impedance stubs. These stubs are located adjacent the FET terminals to physically separate the tuners from the FET package itself. This configuration of connections in the modules allows the proper angle of the desired reflection coefficient to be obtained while the magnitude of the signal is obtained from the quarter wave transformer comprising the adjustable screw tuning means.

While the quarter wave transformers are tuned to vary primarily the magnitude of the reflection coefficient at the FET terminals, the angle is also varied within a limited range. This limited range of variation is used to further adjust the fixed angle as set by the stubs.

As will be ascertained in the art, the width of the transformer means 16 and 18 is enlarged from that of the conductors 30 and 32 to compensate for the reduced dielectric constant (compared to the substrate dielectric constant). The sides of the quarter wave transformer means are tapered to provide a more gradual transition from the 50 ohm narrow line width to the low impedance wide line width of the quarter wave transformer.

The space feedback metal tuning means 81 provides positive feedback between the rain and gate of the FET terminals by perturbing the normal electric field in the space above the FET. At the same time that the gain is being increased, the noise figure is being decreased with this positive feedback. The enhancement of gain and noise figure simultaneously is contrary to what would normally be expected to happen by prior art experts. In other words, it would normally be expected that the noise figure should go up as positive feedback is increased, to raise the gain, if it behaved according to the way that normal feedback has been described in the prior art literature. In one embodiment of the invention, the positive feedback provided by the space feedback tuning means 81 increased the gain of the transistor from an ideal value of 9.5 dB to slightly less than 11 dB. At the same time, the noise figure was not increased substantially beyond the ideal value. Both of these figures were taken in the frequency vicinity of 11 gigahertz.

Although the method in which the space feedback device operates is not fully understood, it is known that it is obtained by a metal reflecting surface suitably located over the FET device and its associated impedance matching circuits. The legs, such as 87, provide further improvement in the gain and noise figures over those figures obtained by just the surface 85 of the tuning means 81.

Although I have described an inventive concept comprising a drop-in module and a space feedback tuning means, I wish to be limited not by the specific embodiments illustrated, but only by the scope of the appended claims, where I claim:

1. A low noise, high frequency amplifier module assembly comprising, in combination:
   substrate means, including ground plane means on one side of said substrate means and source lead openings in said substrate means from said one side to the opposite side;
   gate and drain transmission line means attached to said substrate means on a second side opposite said one side;
   FET amplifying means mounted on said second side of said substrate means with drain and gate leads connected to said drain and gate transmission line means respectively and said source leads connected through said source lead openings in said substrate means to the ground plane means on said one side;
   first transformer tuning means including first and second tuning screws mounted on said one side and juxtaposed said drain transmission line means for adjusting the gain of the amplifier module assembly; and
   second transformer tuning means including first and second tuning screws mounted on said one side and juxtaposed said gate transmission line means for adjusting the noise figure of the amplifier module to a minimum value.

2. Microstrip circuit apparatus for use with a drop-in pretuned amplifier means comprising, in combination:
   substrate material means having first and second opposing sides and including an opening therein extending from said first to said second side for receipt of a drop-in pretuned amplifier means;
   microstrip circuit components mounted on said first side of said substate material means;
   ground plane means attachd to said second side of said substrate means and having a recessed portion therein coinciding with said opening in said substate material means; and
   microstrip transmission line means attached to said substate means and extending from an electrical connection with at least one of said microstrip circuit components to the edge of said opening for connection to the pretuned amplifier means.

3. Apparatus as claimed in claim 1, wherein:
   said gate and drain transmission line means each include tuning stubs to optimally match line impedances to typical amplifying impedances when said tuning screws of said tuning means are at a midrange position.

4. Apparatus as claimed in claim 1 comprising, in addition:
   low impedance open circuit stubs comprising the connection between the FET amplifying means drain and gate leads and said associated transmission line means used in said transformer tuning means.

* * * * *